(12) United States Patent
Nakamura et al.

(10) Patent No.: US 8,773,943 B2
(45) Date of Patent: Jul. 8, 2014

(54) SEMICONDUCTOR DEVICE OUTPUTTING READ DATA IN SYNCHRONIZATION WITH CLOCK SIGNAL

(71) Applicants: Yuki Nakamura, Tokyo (JP); Takuyo Kodama, Tokyo (JP)

(72) Inventors: Yuki Nakamura, Tokyo (JP); Takuyo Kodama, Tokyo (JP)

(*) Notice: Subject to any disclaimer, the term of this patent is extended or adjusted under 35 U.S.C. 154(b) by 0 days.

(21) Appl. No.: 14/137,880

(22) Filed: Dec. 20, 2013

(65) Prior Publication Data

US 2014/0104970 A1 Apr. 17, 2014

Related U.S. Application Data

(63) Continuation of application No. 13/312,859, filed on Dec. 6, 2011, now Pat. No. 8,630,144.

(30) Foreign Application Priority Data

Dec. 13, 2010 (JP) .................................. 2010-277264

(51) Int. Cl.
*G11C 8/00* (2006.01)
*G11C 7/22* (2006.01)

(52) U.S. Cl.
CPC ........................................ *G11C 7/22* (2013.01)
USPC .................................. 365/233.1; 365/233.12

(58) Field of Classification Search
CPC .................................. G11C 7/22; G11C 7/222
USPC .............................. 365/233.1, 233.12, 233.13
See application file for complete search history.

(56) References Cited

U.S. PATENT DOCUMENTS

| | | | | |
|---|---|---|---|---|
| 6,643,215 | B2 * | 11/2003 | Kwak | 365/233.17 |
| 7,259,607 | B2 | 8/2007 | Sommer | |
| 2001/0017558 | A1 | 8/2001 | Hanzawa et al. | |
| 2008/0192563 | A1 * | 8/2008 | Cho | 365/233.17 |
| 2009/0284290 | A1 | 11/2009 | Kuroki et al. | |
| 2010/0223488 | A1 | 9/2010 | Konno et al. | |

FOREIGN PATENT DOCUMENTS

JP 2009-278528 A 11/2009

* cited by examiner

*Primary Examiner* — Vu Le
(74) *Attorney, Agent, or Firm* — McGinn IP Law Group, PLLC

(57) ABSTRACT

A method for outputting data in a semiconductor device includes receiving an external clock signal, synchronizing, in a delay locked loop of the semiconductor device, a first internal clock signal to the external clock signal during a read period, synchronizing, in the delay locked loop, a second internal clock signal to the external clock signal during an active period, the second internal clock signal having a period longer than the first internal clock signal, and outputting data synchronized with the first internal clock signal during the read period.

15 Claims, 10 Drawing Sheets

SEMICONDUCTOR DEVICE OUTPUTTING READ DATA IN SYNCHRONIZATION WITH CLOCK SIGNAL

The present application is a Continuation Application of U.S. patent application Ser. No. 13/312,859 filed on Dec. 6, 2011, which is based on and claims priority from Japanese Patent Application No. 2010-277264, filed on Dec. 13, 2010, the entire contents of which are incorporated herein by reference.

BACKGROUND OF THE INVENTION

1. Field of the Invention

The present invention relates to a semiconductor device and particularly to a semiconductor device which outputs read data in synchronization with an external clock signal.

2. Description of Related Art

Recently, DDR (Double Data Rate) type synchronous memory device used as main memory of a personal computer or the like has been used in many cases as a semiconductor device which performs an operation in synchronization with a high-speed clock signal. For such semiconductor devices, a configuration in which output timing of read data is synchronized with an external clock signal is employed. According to this configuration, data transmission/reception between a controller and a semiconductor device can be performed at timing synchronized with the external clock signal. Therefore, data transmission/reception to each other is performed without an error. By the way, since internal delay is present in the semiconductor device itself, it is necessary to generate an internal clock signal inside the semiconductor device so that the output timing of the read data can be synchronized with the external clock signal while considering the delay time. The circuit realizing that is a DLL (Delay Locked Loop) circuit. Japanese Patent Application Laid-Open No. 2009-278528 discloses an example of such DLL circuit.

The trend of reduction of power consumption of semiconductor devices is increasing recently. Reduction in power consumption of the DLL circuit whose power consumption is said to be large in general can greatly contribute to lower power consumption of the semiconductor device. But on the other hand, since the trend of speeding-up of the semiconductor device is also increasing, improving the accuracy of timing control is becoming increasingly necessary. As a result, power consumption in the DLL circuit tends to be larger. The present invention has an object to provide a semiconductor device with highly accurate timing control while power consumption in such DLL circuit is suppressed.

SUMMARY

In one embodiment, a method for outputting data in a semiconductor device comprising receiving an external clock signal, synchronizing, in a delay locked loop of the semiconductor device, a first internal clock signal to the external clock signal during a read period, synchronizing, in the delay locked loop, a second internal clock signal to the external clock signal during an active period, the second internal clock signal having a period longer than the first internal clock signal, and outputting data synchronized with the first internal clock signal during the read period.

In one embodiment, there is provided a semiconductor device that includes: a plurality of memory cells arranged in a matrix, including a plurality of rows and columns, one of the rows being selected in response to an issue of an active command, one of the columns being selected in response to an issue of a read command; and a clock control circuit producing a clock signal at a first frequency prior to the issue of the read command, and at a second frequency in response to the issue of the read command, the first frequency being greater than zero and smaller than the second frequency.

DETAILED DESCRIPTION OF THE EMBODIMENTS

Preferred embodiments of the present invention will be explained below in detail with reference to the accompanying drawings.

First, in order to facilitate understanding of the features of the invention, the technical idea of the present invention examined by the inventor will be described.

In designing a DLL circuit and the peripheral circuits thereof, the inventor examined means that can maintain accuracy of phase control or the like while the power consumption is reduced as follows. First, regarding the reduction of power consumption, the inventor focused attention on the fact that an internal clock signal LCLK outputted from the DLL circuit is used in reading, while it is not used at the other timing such as writing, and then the inventor found that it is possible to stop the generation of the internal clock signal LCLK at the timing other than in reading. This will reduce power consumption in a buffer circuit 75 and a clock tree 76 in FIG. 1 during a period other than the reading. Though it depends on the operation specification of the semiconductor device, such control is sufficient for a semiconductor device whose so-called operation speed is relatively slow and which does not require high accuracy.

On the other hand, the inventor also found that if such control is made in a semiconductor device whose operation speed is fast and which requires high accuracy, though power consumption is reduced, nonconformity occurs in the internal clock signal LCLK outputted by the DLL circuit, and a demand for high accuracy cannot be satisfied. That is because the stop increases a change of a transitional internal voltage VPERI2 immediately after start of the operation in response to a read command, and as a result, a jitter which disturbs particularly the duty of clock signal in the buffer circuit 75 and the clock tree 76 occurs.

Figure 1:
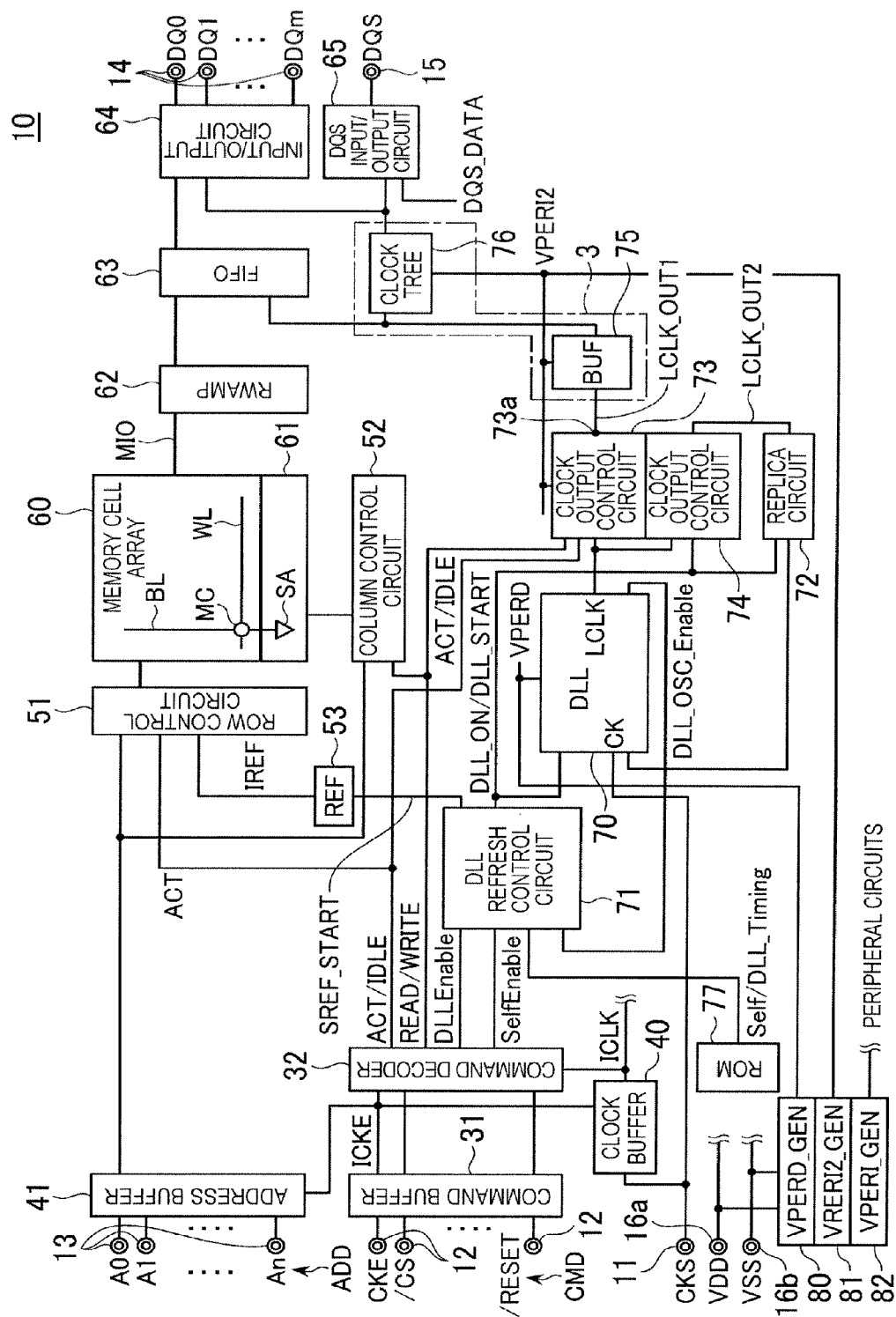
FIG. 1 is a block diagram indicative of an embodiment of an entire configuration of a semiconductor device 10.

The potential of the internal voltage VPERI2 is controlled so as to be equal to a predetermined reference potential by comparing the predetermined reference potential with the internal voltage VPERI2 in an internal power supply generation circuit VPEIR2_GEN in FIG. 1. However, the control cannot follow the above-mentioned transitional voltage change. Therefore, the potential of the internal voltage VPERI2 changes in a short time in the following manner: the first potential→the second potential→the third potential (first>second>third potential). The respective potentials are as follows:

The first potential: a potential raised by the internal power supply generation circuit VPERI2_GEN in a situation in which the buffer circuit 75 and the clock tree 76 are not operating.

The second potential: a potential subjected to transitional potential drop immediately after start of the operations of the buffer circuit 75 and the clock tree 76 in response to a read command (the operation of the internal voltage generation circuit VPERI2_GEN is not reflected in the internal voltage VPERI2 yet).

The third potential: a potential balanced by that the internal voltage generation circuit VPERI2_GEN, the buffer circuit 75 and the clock tree 76 operate.

Both the buffer circuit 75 and the clock tree 76 are fainted of transistors having the internal voltage VPERI2 as the source potentials thereof. Therefore, if the source potentials are changed, the transition time of the clock is also changed (high source potential→fast change, low source potential→slow change). Specifically, in the case in which the source potential is high at rising of a certain clock, while the source potential is low at falling, and the source potential becomes high at the subsequent rising, the clock outputted through the transistor has a large high width and a small low width. That is, the phase of the outputted clock or particularly the duty ratio are largely collapsed.

In order to handle such problems, the inventor invented performing an operation to consume somewhat the internal voltage VPERI2 at timing just before the read command is issued. By this regulation, since the potential of the internal voltage VPERI2 is kept at a potential lower than the first potential and higher than the third potential, a large change is not generated in the internal voltage VPERI2 even at the timing when the read command is issued. Therefore, a relative change in the internal voltage VPERI2 can be kept small, and deterioration of the phase or the duty ratio can be prevented.

Referring now to FIG. 1, the semiconductor device 10 according to the embodiment is a DDR type SDRAM (Synchronous Dynamic Random Access Memory) and is provided with a clock terminal 11, a command terminal 12, an address terminal 13, a data input/output terminal 14 (external data terminal), a data strobe terminal 15, and power terminals 16a and 16b as external terminals.

The clock terminal 11 is a terminal to which an external clock signal CKS is supplied, and the supplied external clock signal CKS is supplied to a clock buffer 40 and a DLL circuit 70. The clock buffer 40 generates a single-phase internal clock signal ICLK on the basis of the external clock signal CKS and supplies it to a command decoder 32 and other circuits, not shown.

The DLL circuit 70 is a circuit which receives the external clock signal CKS and generates an internal clock signal LCLK subjected to phase control with respect to the external clock signal CKS and also duty control. Here, specifically, the phase control is control which adjusts the phase of a rise edge of the clock and the duty control is control which makes a ratio of the rise period and the fall period in one period of the clock (duty ratio) 50:50 by adjusting the phase of the fall edge of the clock. The generated internal clock signal LCLK is supplied to clock output control circuits 73 and 74.

Also, the DLL circuit 70 has a function of determining whether or not the phase of the internal clock signal LCLK and the duty ratio have reached target values (locked), respectively, and a function of activating an oscillator start signal DLL_OSC_Enable when both of the phase of the internal clock signal LCLK and the duty ratio have locked. The oscillator start signal DLL_OSC_Enable is supplied to a DLL refresh control circuit 71.

The DLL refresh control circuit 71 will be described later, but its outline is as follows. Even after the phase control and the duty control are finished (locked) once, the DLL circuit 70 preferably executes phase control or the like again by following a temperature change or the like of the semiconductor device. Thus, the DLL circuit 70 should readjust them after an appropriate period has elapsed from the prior readjustment. The oscillator start signal DLL_OSC_Enable is a start signal which starts measurement of a period from the finish of the prior phase control to the start of the subsequent phase control. The DLL refresh control circuit 71 includes an oscillator circuit and this oscillator circuit starts counting clock signals upon receipt of the oscillator start signal DLL_OSC_Enable. When the number of counts reached a predetermined number, the DLL refresh control circuit 71 activates a DLL start signal DLL_START to instruct readjustment. The measurement of the period is thereby realized. The DLL circuit 70 executes the phase control or the like again upon receipt of the DLL start signal DLL_START.

The clock output control circuit 73 is a circuit which receives the internal clock signal LCLK, generates an internal clock signal LCLK_OUT1 while switching an operation mode in accordance with an active state of each of an internal active command ACT and an internal read command READ, which will be described later, and outputs the obtained internal clock signal LCLK_OUT1 to an output node 73a. This operation mode includes three operation modes, that is, a clock stop mode in which the clock output control circuit 73 does not output the internal clock signal LCLK_OUT1 but fix the potential of the output node 73a to a low level or a high level, a long-period clock output mode in which the clock output control circuit 73 generates a clock signal (long-period clock signal) having a cycle length longer than that of the internal clock signal LCLK and outputs it as the internal clock signal LCLK_OUT1, and a usual clock output mode in which the clock output control circuit 73 outputs the internal clock signal LCLK as the internal clock signal LCLK_OUT1. The output potential of the output node 73a is supplied to an FIFO 63, an input/output circuit 64, and a DQS input/output circuit 65 through a clock transfer circuit 3.

The clock transfer circuit 3 includes the buffer circuit 75 and the clock tree 76. The buffer circuit 75 is a circuit including a plurality of CMOS connected in series, for example, and outputs the internal clock signal LCLK_OUT1 to the FIFO 63 and the clock tree 76. The clock tree 76 is a circuit that distributes the supplied internal clock signal LCLK_OUT1 to the input/output circuit 64 and the DQS input/output circuit 65. The clock tree 76 also includes a plurality of CMOS therein, for example.

The clock output control circuit 74 is a circuit that supplies the internal clock signal LCLK as an internal clock signal LCLK_OUT2 to a replica circuit 72 in case that either a DLL ON signal DLL_ON or a DLL start signal DLL_START, which will be described later, is activated. If neither of them is activated, the output of the clock output control circuit 74 is controlled to be fixed to a low level or a high level.

The replica circuit 72 is a circuit which replicates the clock transfer circuit 3 in a pseudo manner. The internal clock signal LCLK_OUT2 inputted into the replica circuit 72 is subjected to a delay or waveform change substantially equal to the delay or waveform change to which the internal clock signal LCLK_OUT1 is subjected during passing through the clock transfer circuit 3 and is supplied to the DLL circuit 70.

The replica circuit 72 replicates the internal delay of the semiconductor device and the result of the replication is fed back to the DLL circuit 70. The DLL circuit 70 executes timing control of the internal clock signal LCLK based on the result. Thereby, the semiconductor device can output read data at the timing synchronous with the external clock.

The command terminal 12 is a terminal to which various command signals CMD such as a clock enable signal CKE, a row address strobe signal /RAS, a column address strobe signal /CAS, a write enable signal /WE, a chip select signal /CS, an ON DIE termination signal ODT, a reset signal /RESET, an active command signal ACT, a read command signal READ, an idle command signal IDLE, a precharge command signal PRE, a power-down command signal PWDN and the like are supplied. In this specification, the signal with the sign "/" at the beginning of the signal name means that the signal is an inverted signal of a corresponding signal or a low active signal.

The command signal CMD supplied to the command terminal 12 is supplied to the command decoder 32 through a command buffer 31. The internal clock enable signal ICKE which is obtained by buffering the clock enable signal CKE is also supplied to a clock buffer 40 and an address buffer 41. This is for reducing power consumption by stopping the operations of the clock buffer 40 and the address buffer 41 when the clock enable signal CKE is in an inactive state (the internal clock enable signal ICKE is in the inactive state), i.e., in a so-called power-down mode. On the other hand, in the active state, the clock buffer 40 and the address buffer 41 perform buffering operations, respectively.

The command decoder 32 is a circuit which receives the various command signals CMD from the command buffer 31 and performs holding, decoding and counting of the command signals CMD so as to generate various internal commands. These internal commands include various internal commands relating to read/write of a memory cell such as an internal active command ACT, an internal idle command IDLE, an internal read command READ, an internal write command WRITE and the like and also include a DLL enable command DLLEnable which instructs activation/inactivation of the DLL circuit 70, a self-refresh command SelfEnable which instructs start/stop of self-refresh of a memory cell array 60 and the like.

Each of the internal commands generated by the command decoder 32 is supplied to each circuit in the semiconductor device 10. Specifically, the internal active command ACT is supplied to the row control circuit 51, the internal active command ACT, the internal read command READ, and the internal idle command IDLE to the clock output control circuit 73, the internal read command READ to the column control circuit 52, and the DLL enable command DLLEnable and the self-refresh command SelfEnable to the DLL refresh control circuit 71, respectively.

The address terminals 13 are terminals to which an address signal ADD formed of n+1 address bits A0 to An is supplied. The address signal ADD supplied to the address terminals 13 is buffered in the address buffer 41 and a row address is supplied to and latched by the row control circuit 51 and a column address is supplied to and latched by the column control circuit 52. Also, if an entry has been made in a mode register set, a part of the address signal ADD is supplied to a mode register, not shown, by which the contents of the mode register which switches an operation mode of the semiconductor device (burst length, read latency or the like) is updated.

The row control circuit 51 is a circuit which selects one of word lines WL included in a memory cell array 60 on the basis of the row address supplied from the address buffer 41. In the memory cell array 60, a plurality of the word lines WL and a plurality of bit lines BL cross each other, and memory cells MC are arranged at the intersections thereof (In FIG. 1, only one word line WL, one bit line BL and one memory cell MC are illustrated). The bit line BL is connected to a corresponding sense amplifier SA in a sense circuit 61.

The column control circuit 52 is a circuit which selects one of the sense amplifiers SA included in the sense circuit 61. The sense amplifier SA selected by the column control circuit 52 is connected to a read/write amplifier (RWAMP) 62 through a main I/O line MIO.

In a reading operation, read data DQ amplified by the sense amplifier SA is further amplified by the read/write amplifier 62 and outputted to the outside from the data input/output terminal 14 through the FIFO 63 and the input/output circuit 64. On the other hand, in a writing operation, write data DQ inputted from the outside through the data input/output terminal 14 is inputted to the read/write amplifier 62 through the input/output circuit 64 and the FIFO 63 in this order and amplified therein and then, is supplied to the sense amplifier SA.

The data input/output terminal 14 is a terminal to perform output of the read data DQ and input of the write data DQ. In the semiconductor device 10, m+1 (m≥0.0) pieces of data input/output terminals 14 are provided so that data of m+1 bits can be inputted or outputted at the same time.

The FIFO 63 is a circuit in a first-in first-out manner which performs cueing of the read data DQ or the write data DQ and is provided in each of the data input/output terminals 14. Explaining by paying attention to the reading operation, the read data DQ outputted from the read/write amplifier 62 is sorted by a multiplexer, not shown, to each of the data input/output terminal 14 and cued to the corresponding FIFO 63. The FIFO 63 outputs the cued read data DQ to the input/output circuit 64 at the timing synchronous with the internal clock signal LCLK.

The input/output circuit 64 includes an output circuit and an input circuit provided in each of the data input/output terminals 14. Explaining by paying attention to the reading operation, the output buffer shapes the read data DQ outputted from the corresponding FIFO 63 and outputs it to the outside from the corresponding data input/output terminal 14 at the timing synchronous with the internal clock signal LCLK_OUT1.

The data strobe terminal 15 is a terminal to perform input/output of a data strobe signal DQS which becomes an operation reference of data input/output between the DQS input/output circuit 65 and an external controller. The DQS input/output circuit 65 includes an output circuit and an input circuit provided at each data input/output terminal 14.

In the writing, a data strobe signal DQS is inputted from the outside into the DQS input/output circuit 65 through the data strobe terminal 15. The DQS input/output circuit 65 controls timing when the input/output circuit 64 takes in the write data DQ from the data input/output terminal 14 on the basis of the data strobe signal DQS inputted as above.

On the other hand, in the reading, the data strobe data signal DQS_DATA is supplied to the DQS input/output circuit 65 from the inside of the semiconductor device 10. The DQS input/output circuit 65 outputs the data strobe data signal DQS_DATA to the data strobe terminal 15 synchronously with the internal clock signal LCLK_OUT1 supplied from the clock tree 76. The external controller takes in the read data DQ outputted from the data input/output terminal 14 synchronously with the data strobe data signal DQS_DATA outputted as above. That is, the DLL circuit 70 controls the internal clock signal LCLK so that this data strobe data signal DQS_DATA is synchronized with the external clock signal CKS.

The DLL refresh control circuit 71 is a circuit which controls the timing when self-refresh of the memory cell array 60 is performed and the timing when the DLL circuit 70 is started. In this embodiment, both of the timings are controlled by a common oscillator circuit included in the DLL refresh control circuit 71. The purpose for using such a common oscillator circuit is to reduce the area occupied by the oscillator function. Here, since the objects of the present invention are an improvement in accuracy and a reduction of power consumption of DLL, a control method of self-refresh is not related to the present invention. That is, the idea of the present invention also includes provision of circuits for self-refresh and DLL control, respectively, without making them common. To the DLL refresh control circuit 71, in addition to the above-described DLL enable command DLLEnable, the self-refresh command SelfEnable, and the oscillator start signal DLL_OSC_Enable, data Self_Timing indicating the interval of self-refresh and data DLL_Timing indicating the interval of periodic start of the DLL circuit 70 are supplied from a ROM 77. These data is written in the ROM 77 at a point of time during manufacture.

Regarding the DLL circuit 70, first, the DLL refresh control circuit 71 activates the DLL ON signal DLL_ON indicating the activating period of DLL while the inputted DLL enable command DLLEnable is activated and inactivates the DLL ON signal DLL_ON for the rest. The DLL ON signal DLL_ON is supplied to the DLL circuit 70, the clock output control circuit 74, and the replica circuit 72. The DLL circuit 70 executes phase and duty controls of the internal clock signal LCLK while the DLL ON signal DLL_ON is activated and generates the internal clock signal LCLK with those having been adjusted. This is referred to as the first adjustment. When the first adjustment is finished (the DLL circuit is locked), the DLL circuit 70 activates the oscillator start signal DLL_OSC_Enable.

Subsequently, the DLL refresh control circuit 71 activates the DLL start signal DLL_START indicating an update period of the DLL circuit 70 periodically with intervals indicated by data DLL_Timing while the inputted oscillator start signal DLL_OSC_Enable is activated. The DLL start signal DLL_START is configured to be activated after the oscillator start signal DLL_OSC_Enable was inputted into the oscillator circuit, not shown, in the DLL refresh control circuit 71, the oscillator circuit started oscillating to generate the clocks, and the clock number of the clocks reached the predetermined number. This configuration is adopted to adjust the second internal clock LCLK and after in the DLL circuit by the DLL start signal DLL_START. As described above, the DLL circuit 70 periodically adjusts the internal clock signal LCLK. Thereby, the DLL circuit 70 makes it possible to generate the internal clock LCLK in the semiconductor device so that the output timing of the read data can be synchronized with the external clock at any timing.

Regarding self-refresh, the DLL refresh control circuit 71 generates a self-refresh start signal SREF_START periodically with intervals indicated by data Self_Timing in case the self-refresh command SelfEnable is activated and outputs it to a refresh circuit (REF) 53. This self-refresh start signal SREF_START is activated also by the control of the above-described oscillator. The refresh circuit 53 is a circuit which outputs row addresses in the predetermined order. The refresh circuit 53 outputs the row address subsequent to the row address outputted the previous time to the row control circuit 51 upon receipt of the self-refresh start signal SREF_START. By repeating this processing, self-refresh is executed for all the row addresses in the end.

The power supply terminals 16a and 16b are terminals to which external power supply voltages VDD and VSS are supplied, respectively. The internal voltage generation circuits 80 to 82 generate internal voltages VPERD, VPERI2, and VPERI on the basis of the external power supply voltages VDD and VSS, respectively, and supplies them to each circuit in the semiconductor device 10. Specifically, the internal voltage VPERD is supplied as an operation power supply of the DLL circuit 70. Also, the internal voltage VPERI2 is supplied as an operation power supply of the clock output control circuits 73 and 74 and the clock transfer circuit 3 (the buffer circuit 75 and the clock tree 76). The internal voltage VPERI is supplied as an operation power supply of peripheral circuits, not shown.

Each of the internal voltage generation circuits 80 to 82 has a differential amplifier and a driver transistor, respectively, though not shown. The driver transistor is inserted between a power supply wire through which the external power supply voltage VDD is supplied and an internal power supply wire through which the corresponding internal voltage is supplied. A control terminal of the driver transistor is connected to an output terminal of the differential amplifier. The differential amplifier is a circuit which receives a reference voltage having a voltage of a target value of the internal voltage to be generated and operates so that the potential of the corresponding internal power supply wire becomes the same value as the reference voltage by adjusting a voltage to be applied to the control terminal of the driver transistor (a gate—source voltage of the driver transistor). However, they do not become completely the same in actuality, and the potential of the internal power supply wire becomes a value relatively smaller than the reference potential by balancing with a current consumption of the circuit to which the internal voltage is supplied. Also, if the current consumption of the circuit to which the internal voltage is supplied is rapidly increased, control of the differential amplifier cannot follow the increase as described, and the potential of the corresponding internal power supply wire can temporarily drop largely.

Here, operations particularly of the DLL circuit and the peripheral circuits thereof in the above circuit configuration will be described by referring to FIGS. 2 and 3. Here, each of the internal clock signals LCLK2_2 and LCLK4_2 is a signal obtained by doubling or quadruplicating the period of the internal clock signal LCLK.

Figure 2:
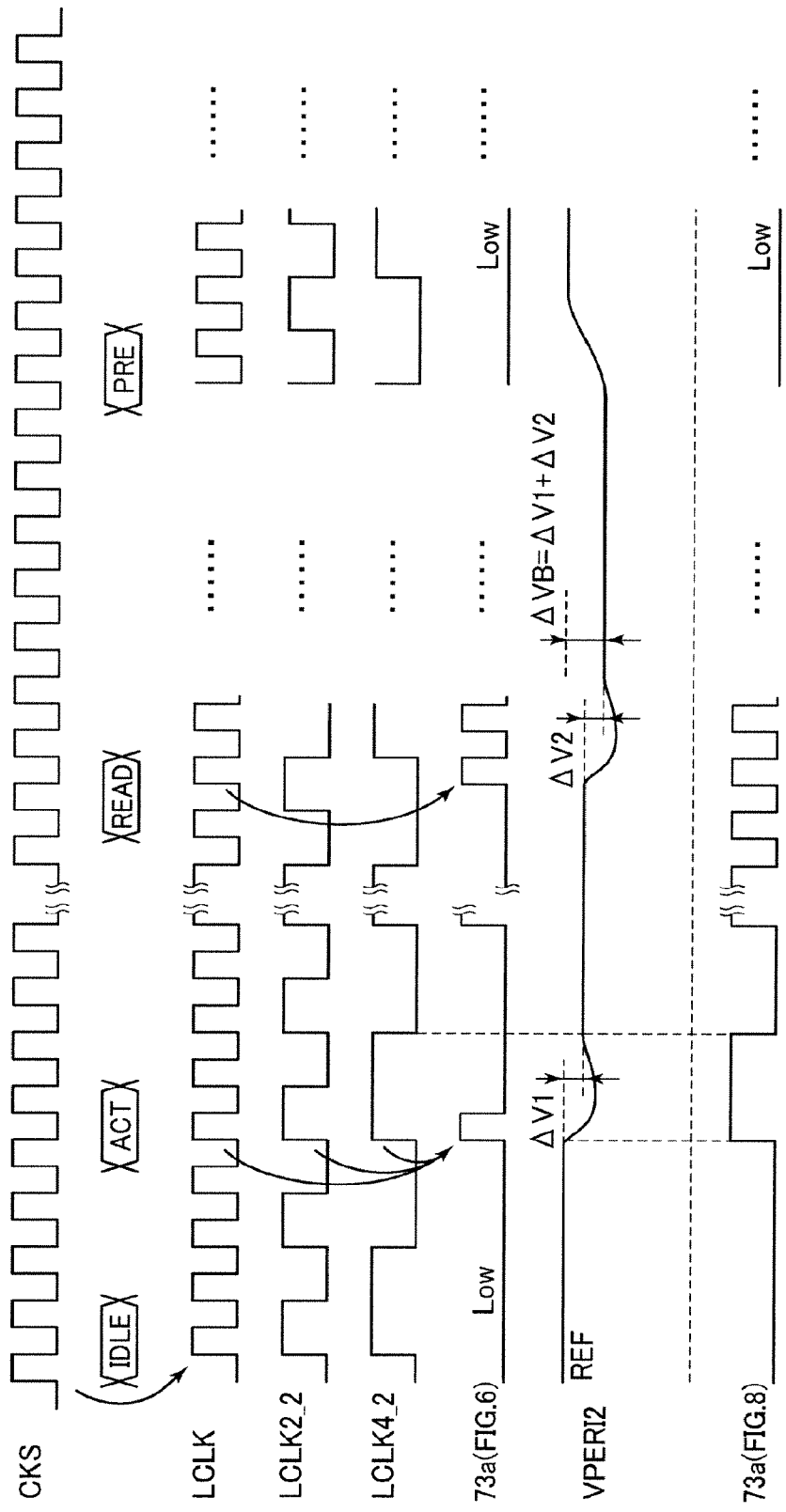
FIG. 2 is a graph indicative of an embodiment of a change over time of the external clock signal CKS, the internal clock signal LCLK, LCLK2_2, LCLK4_2, the potentials of the output node 73a and the internal voltage VPERI2 which is an operation voltage of the clock transfer circuit 3.

When the idle command signal IDLE is supplied from the external controller to the command terminal 12, the DLL circuit 70 is activated in response to that and as illustrated in FIG. 2, generating the internal clock signal LCLK and supplying it to the clock output control circuit 73 or the like are started. In response to that, the clock output control circuit 73 starts generation of the internal clock signals LCLK2_2 and LCLK4_2 as internal processing. At this point of time, the potential of the output node 73a is fixed to a low level (clock stop mode), and the internal voltage VPERI2 is at the predetermined reference potential REF.

Subsequently, in response to the active command signal ACT is supplied, the command decoder 32 activates the internal active command ACT. In the present invention, the period from activation of the internal active command ACT to activation of the internal read command READ is referred to as an "active period". Upon entering the active period, the clock output control circuit 73 starts generating the internal clock signal LCLK_OUT1 and supplying it to the clock transfer circuit 3. Generation of the internal clock signal LCLK_OUT1 is performed by using the internal clock signals LCLK2_2 and LCLK4_2, whose details will be described later.

The internal clock signal LCLK_OUT1 generated within the active period is a long-period clock signal having a period longer than that of the internal clock signal LCLK. FIG. 2 illustrates an example in which the period is quadruplicated. Since generation of the internal clock signal LCLK_OUT1 is started, the potential of the internal voltage VPERI2 is, as illustrated in FIG. 2, gradually increased after it is largely dropped once at the time of start of the active period and becomes stable at the potential of the reference potential REF−ΔV1.

FIG. 2 illustrates two types of the internal clock signal LCLK_OUT1. They are both long-period clock signals, each having a period four times longer than the internal clock signal LCLK, but high pulse widths are different. The high pulse width of the internal clock signal LCLK_OUT1 (FIG. 6) is the same as that of the internal clock signal LCLK and will be described in detail later in a first embodiment. The high pulse width of the internal clock signal LCLK_OUT1 (FIG. 8) is four times longer than the internal clock signal LCLK and will be described in detail later in a second embodiment.

Subsequently, in response to the read command signal READ is supplied, the command decoder 32 activates the internal read command READ. In the present invention, a period from activation of the internal read command READ to completion of output of the read data is referred to as a "read period". The internal clock signal LCLK_OUT1 within the read period is switched to a usual clock signal having the same period as that of the internal clock signal LCLK. As a result, the potential of the internal voltage VPERI2 is, as illustrated in FIG. 2, largely dropped once at the time of start of the read period and then, is gradually increased and becomes stable at the potential of the reference potential REF−ΔV1−ΔV2.

As obvious from FIG. 2, since the internal clock signal LCLK_OUT1 having a long period is generated within the active period, a difference in potential of the internal voltage VPERI2 between the active period and the read period has reduced. That is, in the background art in which the internal clock signal LCLK_OUT1 is not generated within the active period, this difference is ΔV1+ΔV2 (illustrated ΔVB), but since the internal clock signal LCLK_OUT1 is generated within the active period, it is reduced to ΔV2. As a result, the width of the temporary potential drop at the time of start of the read period is also reduced.

By means of such reduction of the potential drop amount, in the semiconductor device 10, fluctuation of the rising time and the falling time of the signal in the beginning of the read period is smaller than that in the background art. Therefore, collapse of the duty ratio (jitter) of the internal clock signal supplied to the input/output circuit 64 through the clock transfer circuit 3 is reduced as compared with the background art. If the jitter of the internal clock signal is reduced, the jitter of the read data DQ outputted synchronously with this internal clock signal is also reduced.

Figure 3:
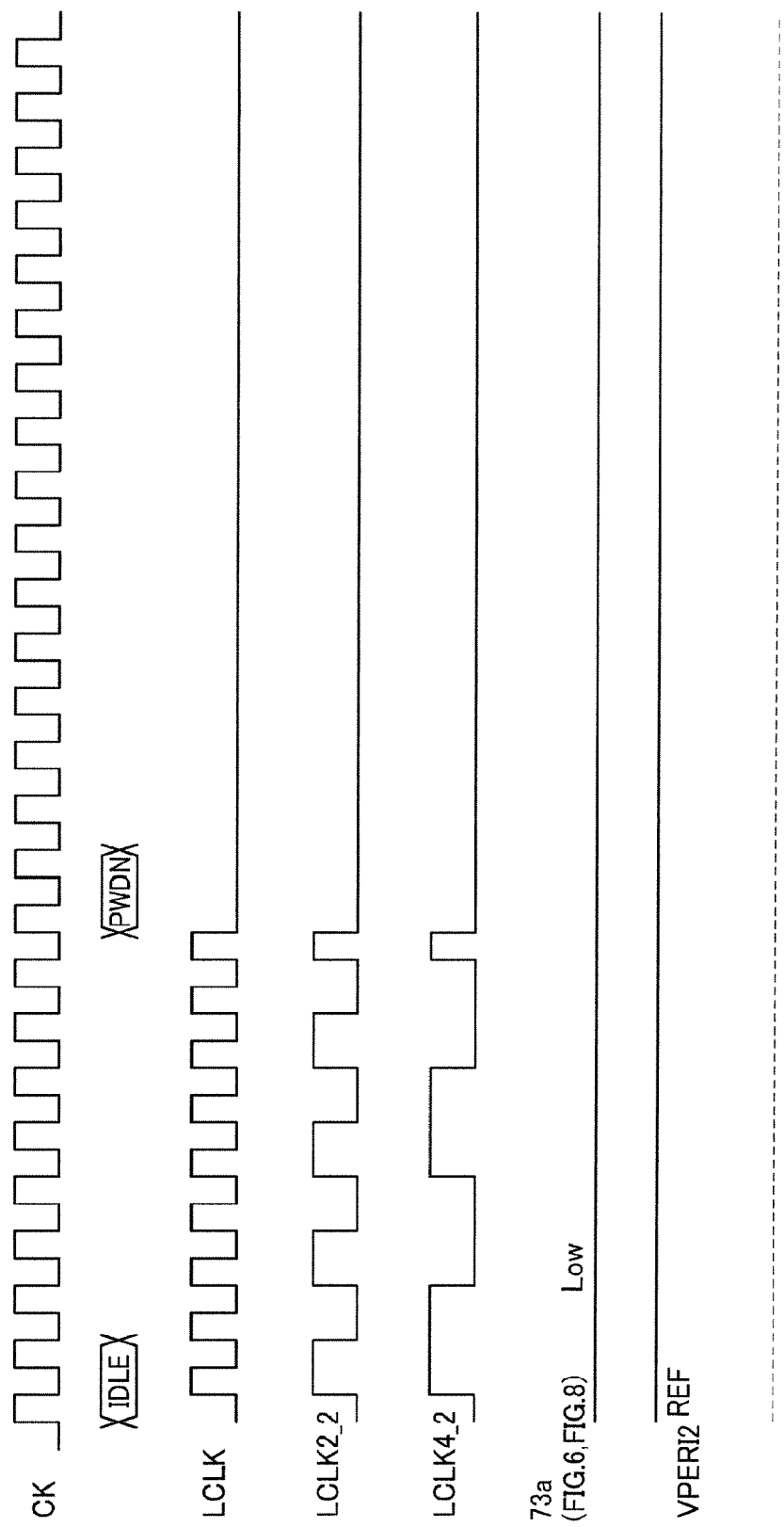
FIG. 3 is a graph indicative of an embodiment of a change over time of the external clock signal CKS, the internal clock signal LCLK, LCLK2_2, LCLK4_2, the potentials of the output node 73a and the internal voltage VPERI2 which is an operation voltage of the clock transfer circuit 3.

Also, as illustrated in FIG. 3, in case the power-down command signal PWDN is supplied from the outside, the DLL circuit 70 stops generation of the internal clock signal LCLK until the idle command signal IDLE is next supplied. In the present invention, a period from supply of the power-down command signal PWDN to supply of the idle command signal IDLE is referred to as a "power-down period". In the power-down period, generation of the internal clock signal LCLK2_2 and LCLK4_2 by the clock output control circuit 73 is also stopped, and the potential of the output node 73a is fixed to a low level. As a result, the current consumption within the power-down period is reduced.

As described above, according to the semiconductor device 10 of this embodiment, since the internal clock signal LCLK_OUT1 is supplied to the clock transfer circuit 3 from the beginning of the active period, the drop amount of the internal voltage VPERI2 in the beginning of the read period is decreased, and the jitter of the read data DQ is reduced. Also, since the clock signal supplied by the clock output control circuit 73 within the active period is a long-period clock signal having a period four times longer than the internal clock signal LCLK, the current consumption of the clock transfer circuit 3 can be suppressed as compared with the case in which the clock output control circuit 73 supplies the internal clock signal LCLK also within the active period. Moreover, the current consumption in the power-down period can also be suppressed.

The entire configuration of the semiconductor device 10 according to this embodiment has been described. Subsequently, the clock output control circuit 73 will be described in detail.

Figure 4:
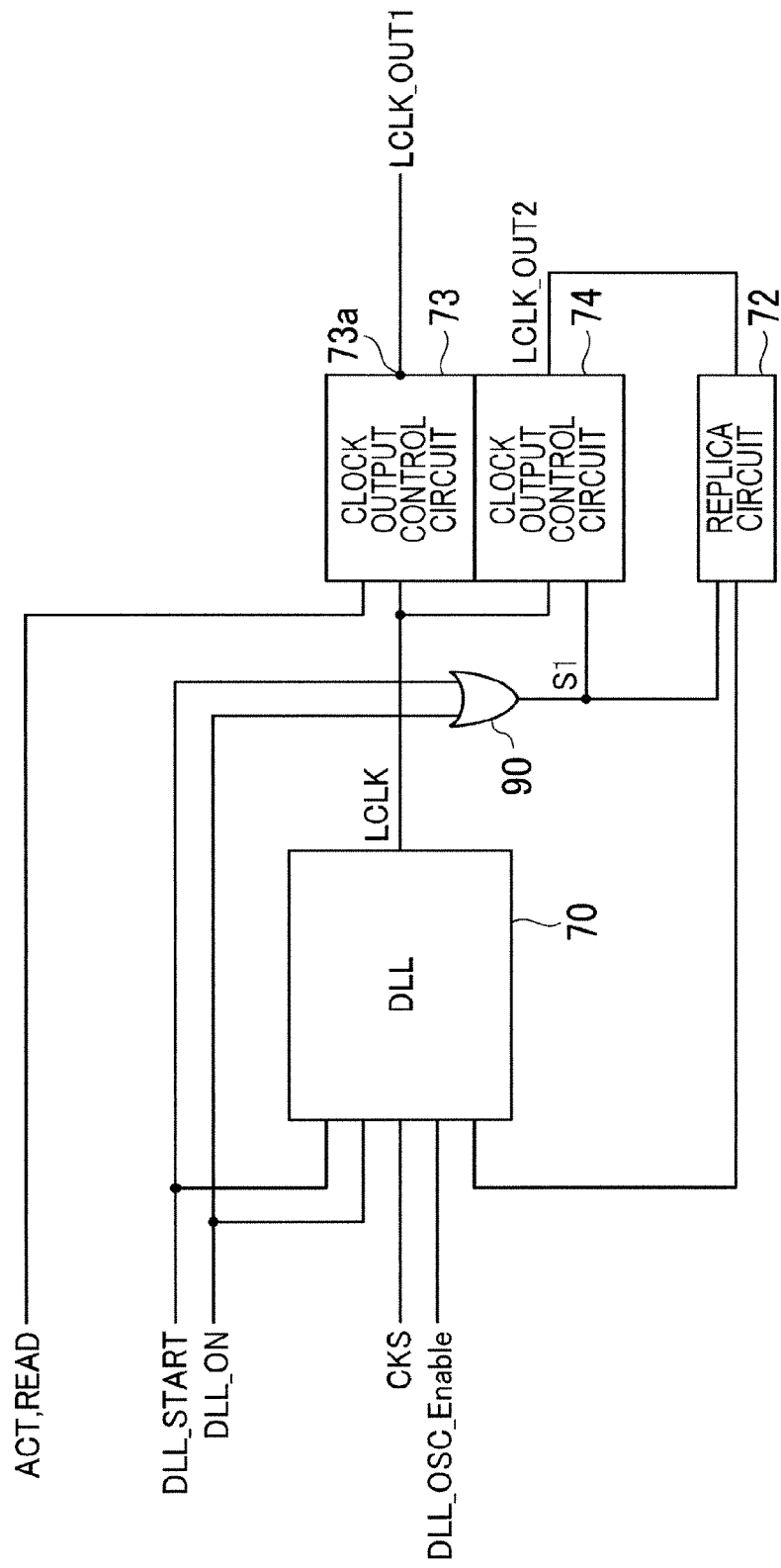
FIG. 4 is a diagram indicative of an embodiment of the configuration of the clock output control circuit 73 shown in FIG. 1 and the peripheral circuits thereof.
Figure 5:
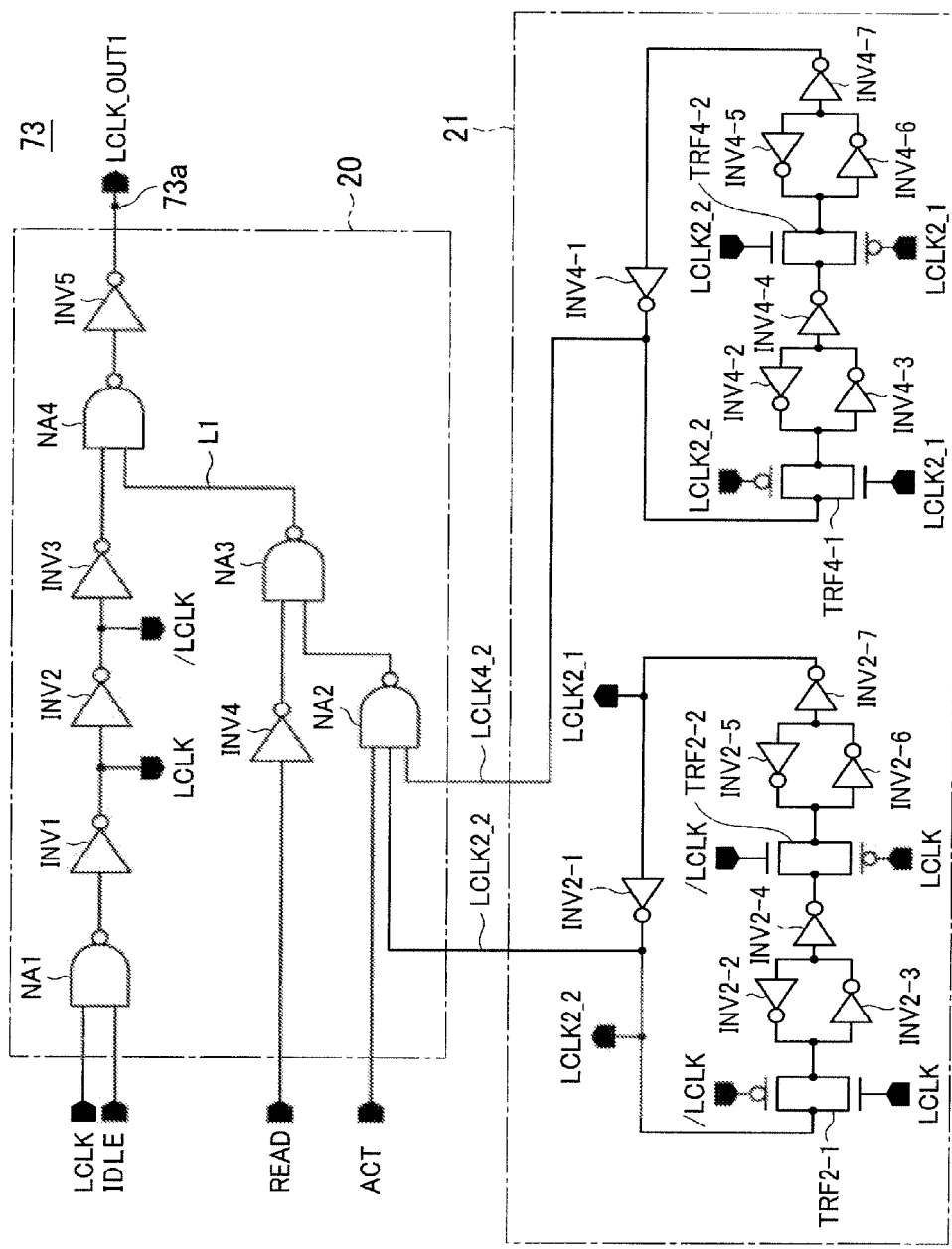
FIG. 5 is a circuit diagram indicative of an embodiment of the internal configuration of the clock output control circuit 73 shown in FIG. 1.

Turning to FIGS. 4 and 5, the first embodiment of the present invention will be described next. In this embodiment, the internal clock signal LCLK_OUT1 having a long period activated within the active period is a signal having a period four times longer than the internal clock signal LCLK and the high pulse width equal to those of the internal clock signal LCLK.

To the DLL circuit 70 illustrated in FIG. 4, the external clock signal CKS, the DLL ON signal DLL_ON, the DLL start signal DLL_START, and the oscillator start signal DLL_OSC_Enable are supplied as described above. The DLL ON signal DLL_ON and the DLL start signal DLL_START are also supplied to an OR circuit 90, and a DLL start signal S1 which is activated in case either one of them is activated and inactivated in the other cases is outputted from the OR circuit 90. The DLL start signal S1 is supplied to the clock output control circuit 74 and the replica circuit 72.

The DLL circuit 70 is a circuit which, upon receipt of the external clock signal CKS, generates internal clock signal LCLK whose phase is controlled with respect to the external clock signal CKS and duty is controlled. Specifically, though not shown, the DLL circuit 70 includes a delay circuit, a phase comparison circuit, a duty comparison circuit, a dividing circuit, and a counter circuit. The delay circuit is a circuit which generates the internal clock signal by delaying the external clock signal, and the delay amount is controlled by a counter value of the counter circuit. The internal clock signal LCLK generated by the delay circuit is inputted to the clock output control circuits 73 and 74, subjected to predetermined control in each of the clock output control circuits 73 and 74, and outputted as the internal clock signals LCLK_OUT1 and LCLK_OUT2, respectively.

Among them, the internal clock signal LCLK_OUT2 is returned to the DLL circuit 70 through the replica circuit 72 as described above. The replica circuit 72 is a circuit formed by imitating the delay amounts of the buffer circuit 75, the clock tree 76, and the DQS output circuit 65 through which the internal clock signal LCLK is transferred. The replica circuit 72 is adopted to make the internal clock signal LCLK synchronize with the external clock signal CKS at the timing when the internal clock signal LCLK is outputted to the outside through the DQS input/output circuit 15. The internal clock signal LCLK_OUT2 having returned to the DLL circuit 70 through the replica circuit 72 is supplied to the phase comparison circuit and the duty comparison circuit. The phase comparison circuit compares the phase of the external clock signal CKS and the phase of the internal clock signal LCLK_OUT2 and outputs the result to the counter circuit. The duty comparison circuit compares the duty ratio of the internal clock signal LCLK_OUT2 with a predetermined value stored in advance and outputs the result to the counter circuit. The counter circuit counts up or down the count value on the basis of the comparison results inputted as above. Here, the dividing circuit is a circuit which divides the external clock signal CKS and outputs the obtained clock as a divided clock in case the oscillator start signal DLL_OSC_Enable has been activated. Update of the count value by the counter circuit is performed in synchronization with the divided clock outputted from the dividing circuit when either of the DLL ON signal DLL_ON and the DLL start signal DLL_START has been activated.

By means of the processing by each circuit as above, the internal clock signal LCLK outputted by the delay circuit is synchronized with the external clock signal CKS at the timing when the internal clock signal itself is outputted to the outside through the DQS input/output circuit 15 and controlled so that the duty ratio becomes the above predetermined value, that is, 50:50.

Subsequently, as illustrated in FIG. 5, the clock output control circuit 73 includes a supply control circuit 20 and a period expansion circuit 21.

The supply control circuit 20 is a circuit which generates a long-period clock signal from a signal obtained from the period expansion circuit 21, supplies this long-period clock signal to the output node 73*a* in accordance with activation of the internal active command ACT and switches supply from the long-period clock signal to the internal clock signal LCLK in response to activation of the internal read command READ.

By executing such control, within the active period from the internal active command ACT to the internal read command READ, the clock output control circuit 73 outputs the long-period clock signal. This long-period clock signal plays a role of lowering the potential of the internal voltage VPERI2 only by $\Delta V1$ as illustrated in FIG. 2, and thereby the potential drop amount (and the potential change amount including potential rise after that) can be kept as low as $\Delta V2$ when the internal read command READ is activated subsequently. Absolute values of $\Delta V1$ and $\Delta V2$ can be adjusted by adjusting an expansion amount set in the period expansion circuit 21. In FIG. 5, the period of the long-period clock signal is set at four times longer than those of the internal clock signal LCLK, but four times is not inevitable and it may be twice or eight times. By setting the period to twice, the value of $\Delta V2$ can be kept much lower than the value at four times ($\Delta V1$ becomes large). On the other hand, when the period is set to eight times, the value of $\Delta V2$ becomes larger but power consumption within the active period can be suppressed.

As a circuit configuration, the supply control circuit 20 has, as illustrated in FIG. 5, NAND circuits NA1 to NA4 and inverters INV1 to INV5. To the NAND circuit NA1, the internal clock signal LCLK and the internal idle command IDLE are supplied. Here, the internal idle command IDLE is a signal which becomes a low level when the semiconductor device 10 is in a sleep mode (the power-down period) and becomes a high level in the other periods. Therefore, the output of the NAND circuit NA1 is fixed to a high level in the power-down period and becomes an inverted signal of the internal clock signal LCLK in the other periods.

The inverters INV1 to INV3 are connected in series in the order from the output end of the NAND circuit NA1. Therefore, when power of the semiconductor device 10 is on, the output signals of the inverters INV1 and INV3 are equal to the internal clock signal LCLK. On the other hand, the output signal of the inverter INV2 is equal to the inverted signal /LCLK of the internal clock signal LCLK. The output signals of the inverters INV1 and INV2 are supplied to the period expansion circuit 21.

To the inverter INV4, the internal read command READ is supplied. The internal read command READ supplied here is a high active signal which is continuously activated from input of the read command READ from the outside to the command terminal 12 to completion of the output of the read data DQ by the input/output circuit 64. The period during which the internal read command READ is activated corresponds to the above-described read period. The output signal of the inverter INV4 is an inverted signal of the internal read command READ.

To the NAND circuit NA2, the internal active command ACT and the clock signals LCLK2_2 and LCLK4_2 outputted by the period expansion circuit 21 are supplied. The internal active command ACT supplied here is a high active signal which is continuously activated from input of the active command ACT from the outside to the command terminal 12 to completion of the output of the read data DQ by the input/output circuit 64. The input of the command from the outside is made in the order of the active command ACT and the read command READ all the time, and the period from activation of the internal active command ACT to activation of the internal read command READ corresponds to the above-described active period. The output signal of the NAND circuit NA2 is at a low level when the internal active command ACT, and the clock signals LCLK2_2 and LCLK4_2 are all at a high level and is at a high level in the other cases.

To the NAND circuit NA3, the output signal of the inverter INV4 and the output signal of the NAND circuit NA2 are supplied. Therefore, the output signal of the NAND circuit NA3 is at a low level when they are both at high and is at a high level in the other cases.

To the NAND circuit NA4, the output signal of the inverter INV3 and the output signal of the NAND circuit NA3 are supplied. Therefore, the output signal of the NAND circuit NA4 is at a low level when they are both at high and at a high level in the other cases. In the following, a wire which connects the output end of the NAND circuit NA3 and the input end of the NAND circuit NA4 to each other is referred to as a wire L1.

To the inverter INV5, the output signal of the NAND circuit NA4 is supplied. The output end of the inverter INV5 is the output node 73a, and thus, the internal clock signal LCLK_OUT1 is an inverted signal of the output signal of the NAND circuit NA4.

The period expansion circuit 21 is a circuit which has a function of expanding the period of the internal clock signal LCLK. Specifically, as illustrated in FIG. 5, it has four transfer gates TRF2-1, TRF2-2, TRF4-1, and TRF4-2, each of which is formed of a P-type channel MOS transistor and an N-type channel MOS transistor, and inverters INV2-1 to INV2-7 and INV4-2 to INV4-7.

The output end of the transfer gate TRF2-1 is connected to the output end of the inverter INV2-2 and the input end of the inverter INV2-3. The input end of the inverter INV2-2 and the output end of the inverter INV2-3 are both connected to the input end of the inverter INV2-4, and the output end of the inverter INV2-4 is connected to the input end of the transfer gate TRF2-2. The output end of the transfer gate TRF2-2 is connected to the output end of the inverter INV2-5 and the input end of the inverter INV2-6. The input end of the inverter INV2-5 and the output end of the inverter INV2-6 are both connected to the input end of the inverter INV2-7, and the output end of the inverter INV2-7 is connected to the input end of the transfer gate TRF2-1 through the inverter INV2-1.

To a control terminal of the P-type channel MOS transistor of the transfer gate TRF2-1 and a control terminal of the N-type channel MOS transistor of the transfer gate TRF2-2, the inverted signal /LCLK of the internal clock signal LCLK is supplied from the supply control circuit 20. On the other hand, to a control terminal of the N-type channel MOS transistor of the transfer gate TRF2-1 and a control terminal of the P-type channel MOS transistor of the transfer gate TRF2-2, the internal clock signal LCLK is supplied from the supply control circuit 20. From the output end of the inverter INV2-7, the clock signal LCLK2_1 is taken out, and from the output end of the inverter INV2-1, the clock signal LCLK2_2 is taken out. The clock signal LCLK2_2 is, as described above, supplied to the NAND circuit NA2 in the supply control circuit 20.

By means of the above configuration, the clock signal LCLK2_2 becomes a signal obtained by doubling the period of the internal clock signal LCLK as illustrated in FIG. 2.

Returning to FIG. 5, the output end of the transfer gate TRF4-1 is connected to the output end of the inverter INV4-2 and the input end of the inverter INV4-3. The input end of the inverter INV4-2 and the output end of the inverter INV4-3 are both connected to the input end of the inverter INV4-4, and the output end of the inverter INV4-4 is connected to the input end of the transfer gate TRF4-2. The output end of the transfer gate TRF4-2 is connected to the output end of the inverter INV4-5 and the input end of the inverter INV4-6. The input end of the inverter INV4-5 and the output end of the inverter INV4-6 are both connected to the input end of the inverter INV4-7, and the output end of the inverter INV4-7 is connected to the input end of the transfer gate TRF4-1 through the inverter INV4-1.

To a control terminal of the P-type channel MOS transistor of the transfer gate TRF4-1 and a control terminal of the N-type channel MOS transistor of the transfer gate TRF4-2, the clock signal LCLK2_2 is supplied. On the other hand, to a control terminal of the N-type channel MOS transistor of the transfer gate TRF4-1 and a control terminal of the P-type channel MOS transistor of the transfer gate TRF4-2, the clock signal LCLK2_1 is supplied. From the output end of the inverter INV4-1, the clock signal LCLK4_2 is taken out. The clock signal LCLK4_2 is, as described above, supplied to the NAND circuit NA2 in the supply control circuit 20.

By means of the above configuration, the clock signal LCLK4_2 becomes a signal obtained by quadruplicating the period of the internal clock signal LCLK as illustrated in FIG. 2.

By means of the above-described configuration, first, in case the internal idle command IDLE is at a low level, the potential of the output node 73a is fixed to a low level (clock stop mode). In this case, the internal clock signal LCLK_OUT1 is not supplied to the clock transfer circuit 3.

On the other hand, in case the internal idle command IDLE is at a high level, during the period from activation of the internal active command ACT to activation of the internal read command READ (active period), a logical product signal of the clock signal LCLK2_2, the clock signal LCLK4_2, and the internal clock signal LCLK is outputted as the internal clock signal LCLK_OUT1 to the output node 73a (long-period clock output mode). In this embodiment, this logical product signal corresponds to a long-period clock signal having a period longer than the internal clock signal LCLK.

Also, during the period from activation of the internal read command READ to inactivation of the internal read command READ (read period), the internal clock signal LCLK is outputted as the internal clock signal LCLK_OUT1 to the output node 73a (usual clock output mode).

Figure 6:
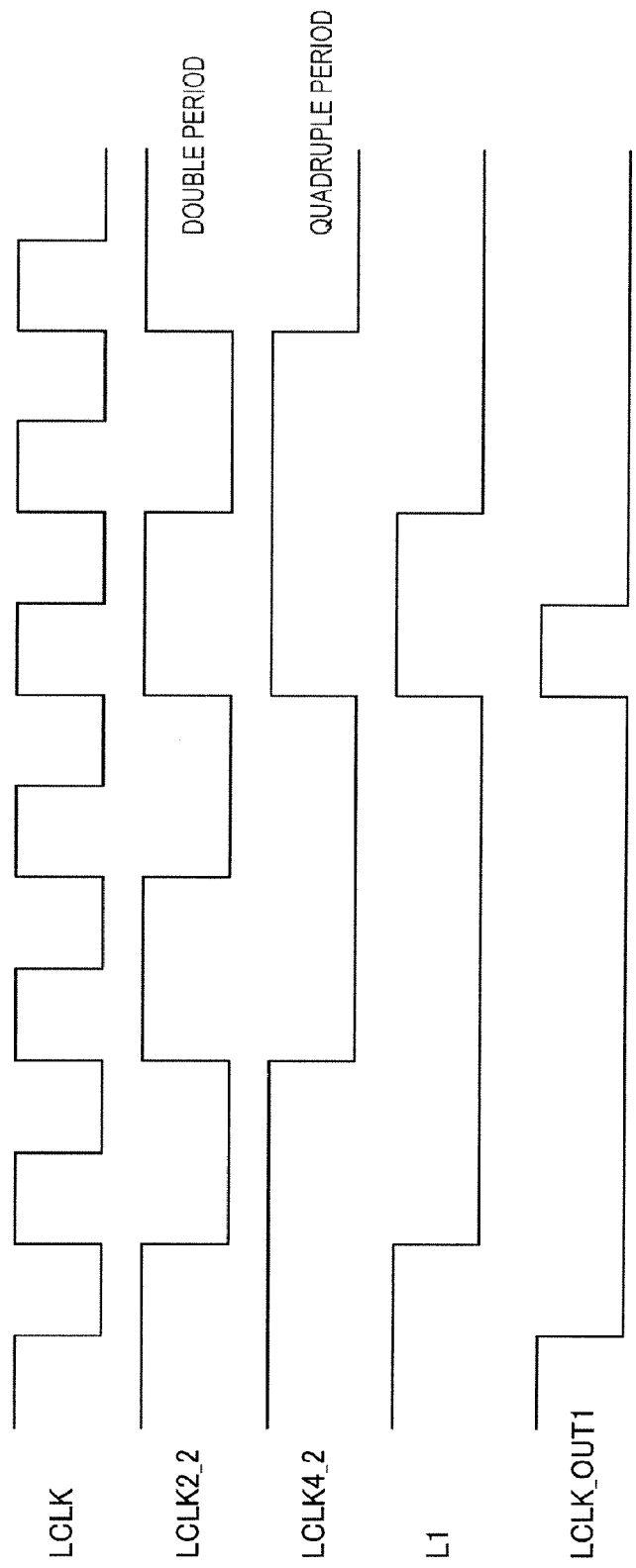
FIG. 6 is a timing chart indicative of an embodiment of a change over time in a long-period clock output mode of each signal relating to a clock output control circuit 73 shown in FIG. 1.

Turning to FIG. 6, as illustrated in the figure, the potential of the wire L1 is a logical product signal of the clock signal LCLK2_2 and the clock signal LCLK4_2, and the internal clock signal LCLK_OUT1 is a logical product signal of the potential of the wire L1 and the internal clock signal LCLK. As a result, the internal clock signal LCLK_OUT1 in the long-period clock output mode becomes, as illustrated in FIG. 2, a long-period clock signal having a period four times longer than the internal clock signal LCLK.

Figure 7:
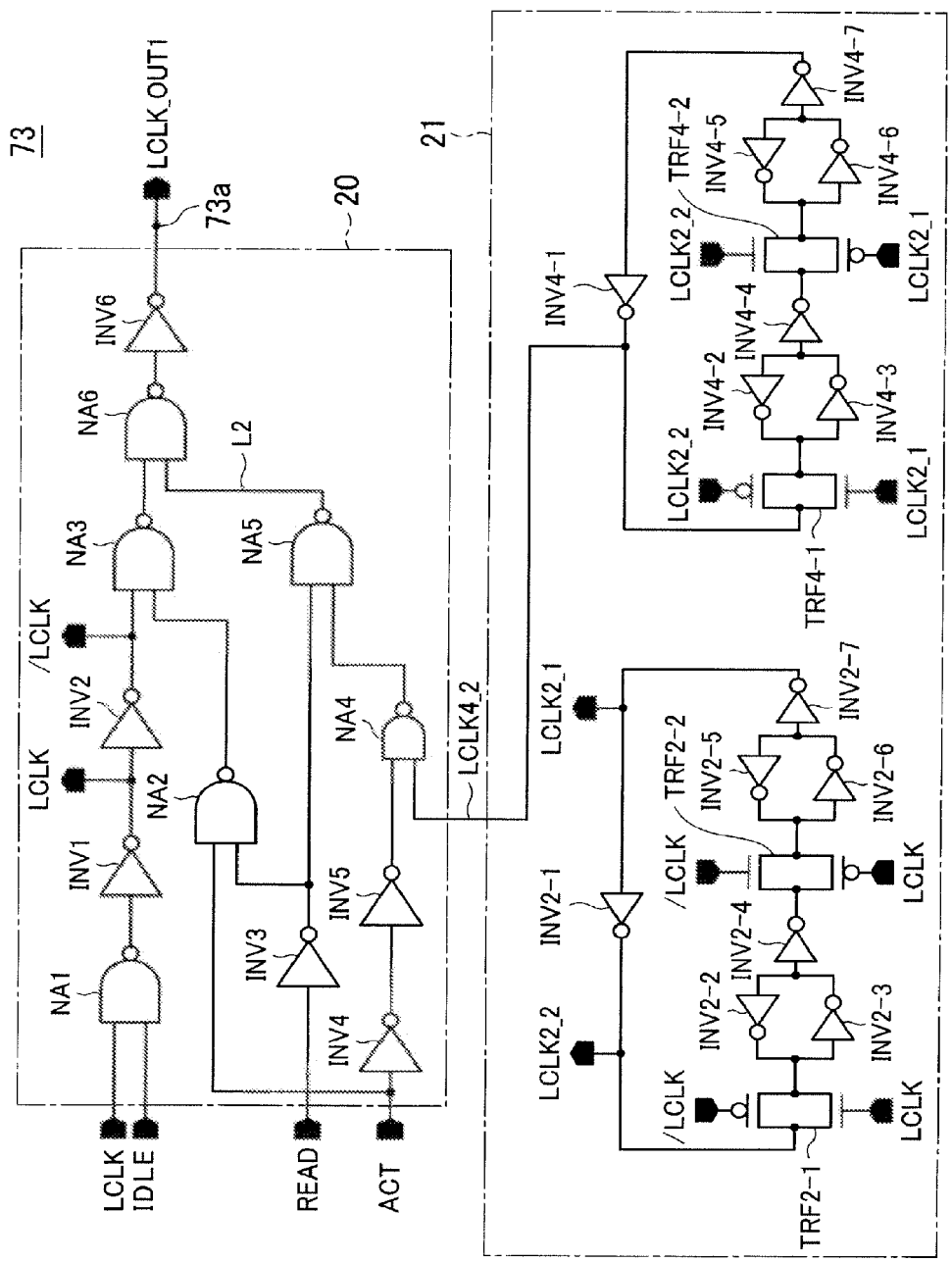
FIG. 7 is a circuit diagram indicative of an embodiment of an internal configuration of the clock output control circuit 73 shown in FIG. 1.

Turning to FIG. 7, the second embodiment of the present invention will be described next. The semiconductor device according to this embodiment is the same as the semiconductor device 10 according to the first embodiment except the internal configuration of the clock output control circuit 73, and thus, only the internal configuration of the clock output control circuit 73 will be described below.

As illustrated in FIG. 7, the clock output control circuit 73 according to this embodiment also has the supply control circuit 20 and the period expansion circuit 21. However, their internal configurations are different from that described in the first embodiment, and as a result, in this embodiment, the internal clock signal LCLK_OUT1 having a long period activated in the active period is a signal having a period four times longer than the internal clock signal LCLK and the high pulse width four times longer than the internal clock signal LCLK. That will be described below in detail.

The supply control circuit 20 according to this embodiment has, as illustrated in FIG. 7, the NAND circuits NA1 to NA6 and the inverters INV1 to INV6. The internal clock signal LCLK and the internal idle command IDLE are supplied to the input end of the NAND circuit NA1. The internal read command READ is supplied to the input end of the inverter INV3. The internal active command ACT is supplied to the input end of the inverter INV4 and the input end of the NAND circuit NA2.

The output end of the NAND circuit NA1 is connected to the input end of the NAND circuit NA3 through the inverters INV1 and INV2 in this order. The output end of the NAND circuit NA2 is also connected to the input end of the NAND circuit NA3. The output end of the inverter INV3 is connected to the input end of the NAND circuit NA2 and the input end of the NAND circuit NA5. The output end of the inverter INV4 is connected to the input end of the NAND circuit NA4 through the inverter INV5. The output end of the NAND circuit NA4 is connected to the input end of the NAND circuit NA5.

The output ends of the NAND circuits NA3 and NA5 are both connected to the input end of the NAND circuit NA6. A wire which connects the output end of the NAND circuit NA5 and the input end of the NAND circuit NA6 to each other is referred to as a wire L2 in the following. The output signal of the NAND circuit NA6 is outputted to the output node 73a through the inverter INV6. Therefore, the internal clock signal LCLK_OUT1 becomes an inverted signal of the output signal of the NAND circuit NA6.

The period expansion circuit 21 according to this embodiment is different from the period expansion circuit 21 illustrated in FIG. 5 in a point that the clock signal LCLK2_2 is not supplied to the supply control circuit 20 as illustrated in FIG. 7. The both period expansion circuits are the same in the other points, and detailed explanation will be omitted.

By means of the above-described configuration, first, in case the internal idle command IDLE is at a low level, the potential of the output node 73a is fixed to a low level (clock stop mode). In this case, the internal clock signal LCLK_OUT1 is not supplied to the clock transfer circuit 3.

On the other hand, in case the internal idle command IDLE is at a high level, during the period from activation of the internal active command ACT to activation of the internal read command READ (active period), the clock signal LCLK4_2 is outputted as the internal clock signal LCLK_OUT1 to the output node 73a (long-period clock output mode). In this embodiment, the clock signal LCLK4_2 corresponds to the long-period clock signal having a period longer than the internal clock signal LCLK.

Also, during the period from activation of the internal read command READ to inactivation of the internal read command READ (read period), the internal clock signal LCLK is outputted as the internal clock signal LCLK_OUT1 to the output node 73a (usual clock output mode).

Figure 8:
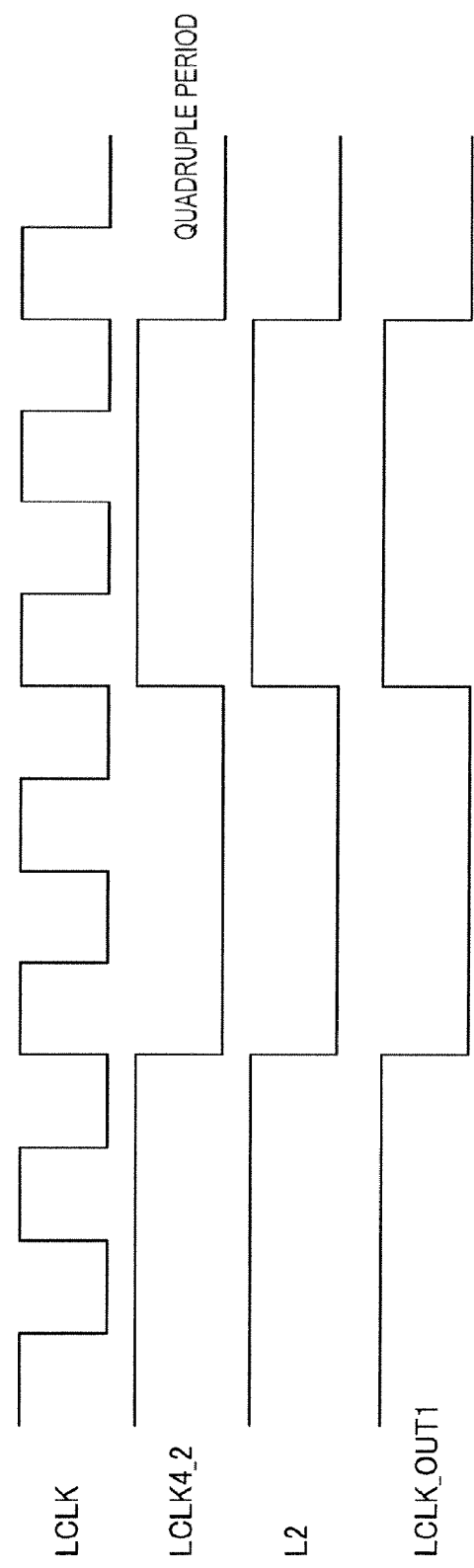
FIG. 8 is a timing chart indicative of an embodiment of a change over time in the long-period clock output mode of each signal relating to the clock output control circuit 73 shown in FIG. 1.

Turning to FIG. 8, among the signals illustrated in the figure, the internal clock signal LCLK and the clock signal LCLK4_2 are the same as those illustrated in FIG. 6.

As illustrated in FIG. 8, the potential of the wire L2 is the same as the clock signal LCLK4_2, and the clock signal LCLK4_2 appears as it is in the internal clock signal LCLK_OUT1. As a result, the long-period clock signal according to this embodiment becomes a signal having the duty ratio of 50:50 as illustrated in FIG. 8 instead of a pulse-state signal such as the internal clock signal LCLK_OUT1 as illustrated in FIG. 6.

As described above, according to the semiconductor device 10 of this embodiment, the long-period clock signal to be supplied to the clock transfer circuit 3 in the long-period clock output mode can be made a signal with the duty ratio of 50:50.

Figure 9:
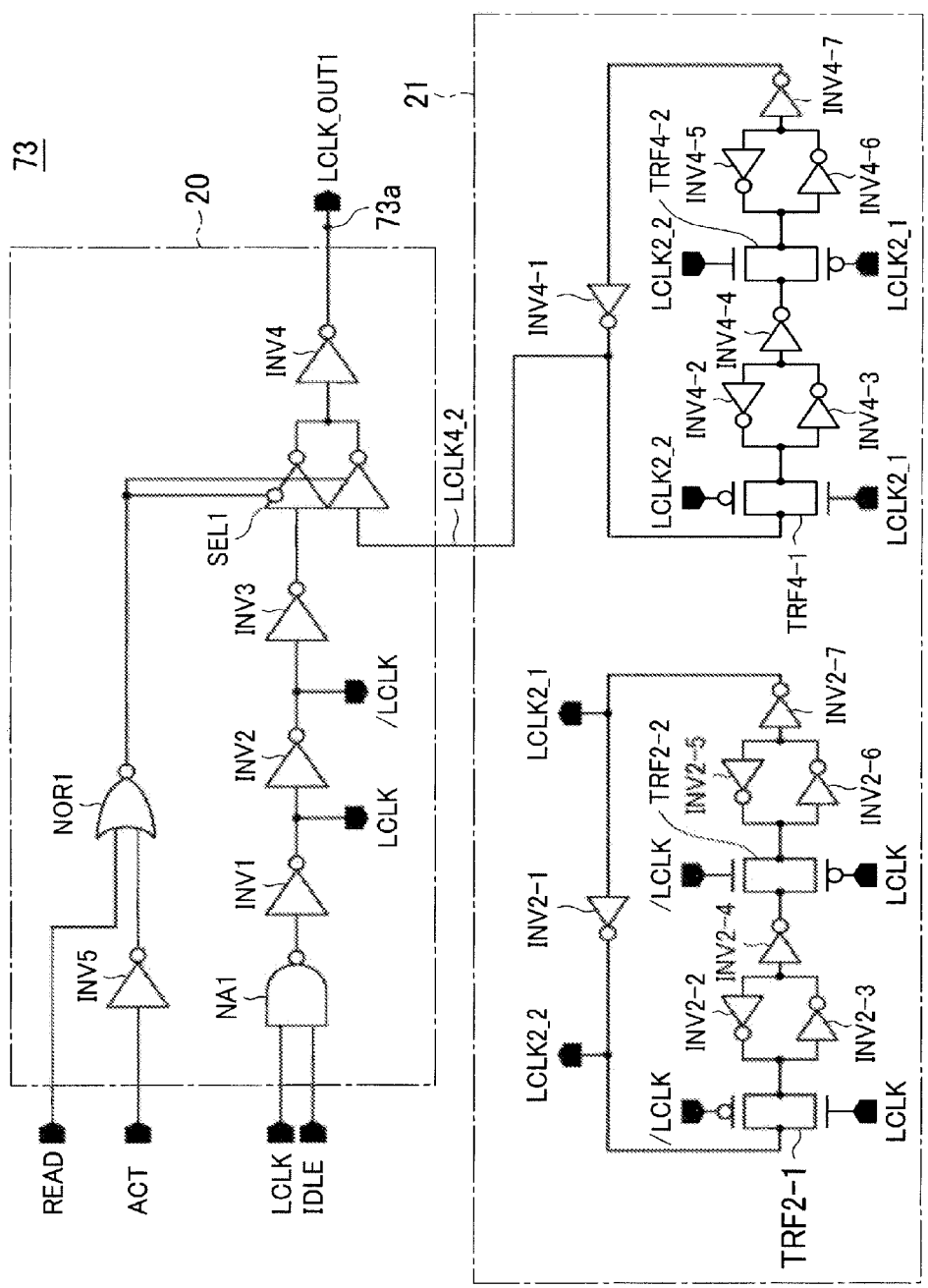
FIG. 9 is a circuit diagram indicative of an embodiment of an internal configuration of the clock output control circuit 73 shown in FIG. 1.

Turning to FIG. 9, a variation of the second embodiment of the present invention will be described next. In this variation, the internal clock signal LCLK_OUT1 outputted from the clock output control circuit 73 is the same as that in the second embodiment, but the internal configuration of the supply control circuit 20 is different from that of the second embodiment. Thus, the internal configuration of the supply control circuit 20 according to this variation will be described below in detail.

The supply control circuit 20 according to this variation has the NAND circuit NA1, the inverters INV1 to INV5, an NOR circuit NOR1, and a selector circuit SEL1 as illustrated in FIG. 9. The internal clock signal LCLK and the internal idle command IDLE are supplied to the input end of the NAND circuit NA1. The internal read command READ is supplied to the input end of the NOR circuit NOR1. The internal active command ACT is supplied to the input end of the NOR circuit NOR1 through the inverter INV5.

The output end of the NAND circuit NA1 is connected to one of input ends of the selector circuit SEL1 through the inverters INV1 to INV3 in this order. To the other input end of the selector circuit SEL1, the clock signal LCLK4_2 is supplied from the period expansion circuit 21.

The selector circuit SEL1 is configured to output an inverted signal of the clock signal LCLK4_2 when the output of the NOR circuit NOR1 is at a high level and to output an inverted signal of the output signal of the inverter INV3 when the output of the NOR circuit NOR1 is at a low level. The output signal of the selector circuit SEL1 is outputted to the output node 73a through the inverter INV4. Therefore, the internal clock signal LCLK_OUT1 becomes an inverted signal of the output signal of the selector circuit SEL1.

By means of the above-described configuration, first, in case the internal idle command IDLE is at a low level, since the internal active command ACT and the internal read command READ are also at a low level in this case, the output signal of the selector circuit SEL1 is fixed to a high level. Therefore, the potential of the output node 73a is fixed to a low level (clock stop mode).

On the other hand, in case the internal idle command IDLE is at a high level, during the period from activation of the internal active command ACT to activation of the internal read command READ (active period), the clock signal LCLK4_2 is outputted as the internal clock signal LCLK_OUT1 to the output node 73a (long-period clock output mode). In this variation, the clock signal LCLK4_2 also corresponds to the long-period clock signal with a period longer than the internal clock signal LCLK.

Also, during the period from activation of the internal read command READ to inactivation of the internal read command READ (read period), the internal clock signal LCLK is outputted as the internal clock signal LCLK_OUT1 to the output node 73a (usual clock output mode).

That is, according to this embodiment, by using the supply control circuit 20 having the internal configuration different from that of the second embodiment, the same internal clock signal LCLK_OUT1 as that in the second embodiment can be obtained.

Figure 10:
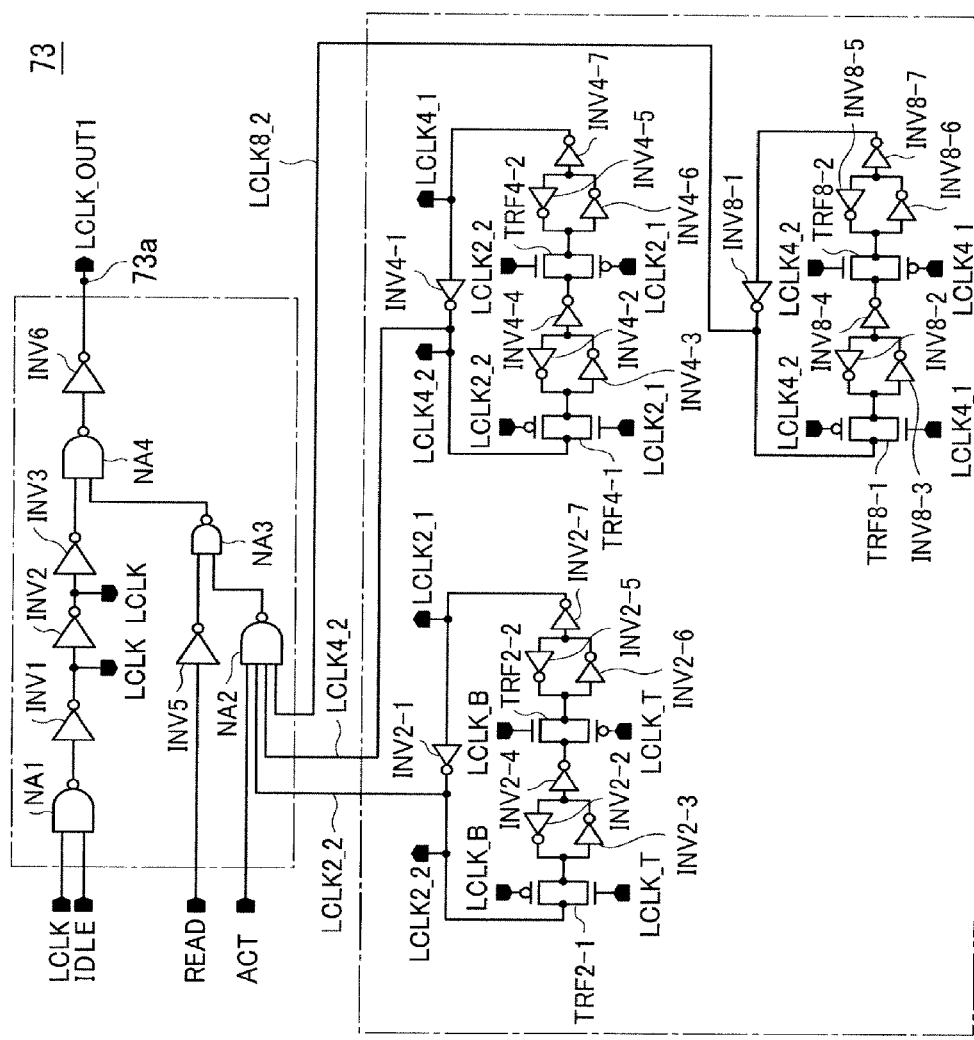
FIG. 10 is a circuit diagram indicative of an embodiment of an internal configuration of the clock output control circuit 73 shown in FIG. 1.

Turning to FIG. 10, a third embodiment of the present invention will be described next. The semiconductor device according to this embodiment is also the same as the semiconductor device 10 according to the first embodiment except the internal configuration of the clock output control circuit 73, and thus, only the internal configuration of the clock output control circuit 73 will be described below.

As illustrated in FIG. 10, the clock output control circuit 73 according to this embodiment also includes the supply control circuit 20 and the period expansion circuit 21. However, their internal configurations are different from that described in the first embodiment, and as a result, the waveform of the long-period clock signal is different from that in the first embodiment. That will be described below in detail.

The supply control circuit 20 according to this embodiment is different from the supply control circuit 20 illustrated in FIG. 3 in a point that the NAND circuit NA2 is formed of four inputs and a clock signal LCLK8_2 outputted by the period expansion circuit 21 is also supplied in addition to the internal active command ACT and the clock signals LCLK2_2 and LCLK4_2 as illustrated in FIG. 10. The both supply control circuits are the same in the other points, and detailed explanation will be omitted.

The period expansion circuit 21 according to this embodiment is different from the period expansion circuit 21 illustrated in FIG. 5 in a point in which it further has two transfer gates TRF8-1 and TRF8-2, each of which is formed by the P-type channel MOS transistor and the N-type channel MOS transistor and the inverters INV8-1 to INV8-7 as illustrated in FIG. 10. Also, the period expansion circuit 21 according to this embodiment is also different from the period expansion circuit 21 illustrated in FIG. 5 in a point in which the clock signal LCLK4__1 is taken out from the output end of the inverter INV4-7. The differences will be mainly described below.

The output end of the transfer gate TRF8-1 is connected to the output end of the inverter INV8-2 and the input end of the inverter INV8-3. The input end of the inverter INV8-2 and the output end of the inverter INV8-3 are both connected to the input end of the inverter INV8-4, and the output end of the inverter INV8-4 is connected to the input end of the transfer gate TRF8-2. The output end of the transfer gate TRF8-2 is connected to the output end of the inverter INV8-5 and the input end of the inverter INV8-6. The input end of the inverter INV8-5 and the output end of the inverter INV8-6 are both connected to the input end of the inverter INV8-7, and the output end of the inverter INV8-7 is connected to the input end of the transfer gate TRF8-1 through the inverter INV8-1.

To a control terminal of the P-type channel MOS transistor of the transfer gate TRF8-1 and a control terminal of the N-type channel MOS transistor of the transfer gate TRF8-2, the clock signal LCLK4_2 is supplied. On the other hand, to a control terminal of the N-type channel MOS transistor of the transfer gate TRF8-1 and a control terminal of the P-type channel MOS transistor of the transfer gate TRF8-2, the clock signal LCLK4__1 is supplied. From the output end of the inverter INV8-1, the clock signal LCLK8_2 is taken out. The clock signal LCLK8_2 is, as described above, supplied to the NAND circuit NA2 in the supply control circuit 20.

By means of the above-described configuration, first, in case the internal idle command IDLE is at a low level, the potential of the output node 73a is fixed to a low level (clock stop mode).

On the other hand, in case the internal idle command IDLE is at a high level, during the period from activation of the internal active command ACT to activation of the internal read command READ (active period), a logical product signal of the clock signal LCLK2_2, the clock signal LCLK4_2, the clock signal LCLK8_2, and the internal clock signal LCLK is outputted as the internal clock signal LCLK_OUT1 to the output node 73a (long-period clock output mode). In this embodiment, this logical product signal corresponds to the long-period clock signal with a period longer than the internal clock signal LCLK.

Also, during the period from activation of the internal read command READ to inactivation of the internal read command READ (read period), the internal clock signal LCLK (second clock signal) is outputted as the internal clock signal LCLK_OUT1 to the output node 73a (usual clock output mode).

The clock signal LCLK8_2 is a period signal having a period eight times longer than the internal clock signal LCLK. Therefore, the long-period clock signal according to this embodiment is a period signal having a period eight times longer than the internal clock signal LCLK.

As described above, according to the semiconductor device 10 of this embodiment, the period of the long-period clock signal to be supplied to the clock transfer circuit 3 within the active period can be made eight times longer than the period of the internal clock signal LCLK. Therefore, the current consumption of the clock transfer circuit 3 can be further suppressed.

It is apparent that the present invention is not limited to the above embodiments, but may be modified and changed without departing from the scope and spirit of the invention.

What is claimed is:

1. A method for outputting data in a semiconductor device comprising:
   receiving an external clock signal;
   synchronizing, in a delay locked loop of the semiconductor device, a first internal clock signal to the external clock signal during a read period;
   synchronizing, in the delay locked loop, a second internal clock signal to the external clock signal during an active period, the second internal clock signal having a period longer than the first internal clock signal; and
   outputting data synchronized with the first internal clock signal during the read period.

2. The method as claimed in claim 1, further comprising disabling the delay locked loop in a clock-stop mode.

3. The method as claimed in claim 1, wherein the period of the first clock signal is the same as the period of the external clock signal.

4. The method as claimed in claim 1, wherein the second clock signal is generated by dividing an output of the delay locked loop.

5. The method as claimed in claim 1, wherein the second clock signal has a period n times the period of the first clock signal, where n is an integer.

6. The method as claimed in claim 5, wherein the second clock signal has twice the period of the first clock signal.

7. The method as claimed in claim 5, wherein the second clock signal has four times the period of the first clock signal.

8. The method as claimed in claim 1, further comprising outputting the first clock signal.

9. The method as claimed in claim 1, wherein the output data is synchronized with both edges of the first clock signal.

10. The method as claimed in claim 1, further comprising adjusting the duty ratio of the first clock signal.

11. The method as claimed in claim 10, wherein the duty ratio of the first clock signal is adjusted to approximately 50/50.

12. The method as claimed in claim 1, wherein the output data is read from a memory array.

13. The method as claimed in claim 12, wherein the output data is read from a dynamic memory array.

14. The method as claimed in claim 1, wherein the semiconductor device is a synchronous dynamic random access memory.

15. The method as claimed in claim 14, wherein the semiconductor device is a double data rate synchronous dynamic random access memory.

* * * * *